United States Patent [19]

Miller

[11] Patent Number: 4,873,512
[45] Date of Patent: Oct. 10, 1989

[54] ACTIVE SHAFT GROUNDING AND DIAGNOTIC SYSTEM

[75] Inventor: Robert C. Miller, Penn Hills, Pa.

[73] Assignee: Westinghouse Electric Corp., Pittsburgh, Pa.

[21] Appl. No.: 591,636

[22] Filed: Mar. 20, 1984

[51] Int. Cl.$^4$ .......................................... G08B 21/00
[52] U.S. Cl. .................................. 340/679; 340/649; 361/212
[58] Field of Search ............... 340/648, 649, 679, 682; 73/116, 660; 415/118; 361/212, 221

[56] References Cited

U.S. PATENT DOCUMENTS

| | | | |
|---|---|---|---|
| 3,787,706 | 1/1974 | DeGeest | 361/221 X |
| 3,831,160 | 8/1974 | Cronin et al. | 340/649 X |
| 4,147,982 | 4/1979 | Emery | 340/647 X |
| 4,167,004 | 9/1979 | Schenck et al. | 340/679 |
| 4,478,082 | 10/1984 | Sato et al. | 73/660 X |

FOREIGN PATENT DOCUMENTS 818532 9/1937 France .................................. 361/212

Primary Examiner—Joseph A. Orsino
Assistant Examiner—Jeffery A. Hofsass
Attorney, Agent, or Firm—Dean Schron

[57] ABSTRACT

In a steam turbine-generator system wherein the turbine shaft is subject to an electrostatic charge buildup, an active grounding system continuously maintains the shaft at substantially ground potential. A feedback circuit is connected between two brushes contacting the rotating shaft and is operable to generate a current of a magnitude to prevent electrostatic discharge as a function of the voltage as sensed by one of the brushes. A current sensor monitors the current supplied by the feedback circuit to the shaft and the output of the current sensor is utilized to diagnose various operating conditions of the steam turbine-generator system.

14 Claims, 4 Drawing Sheets

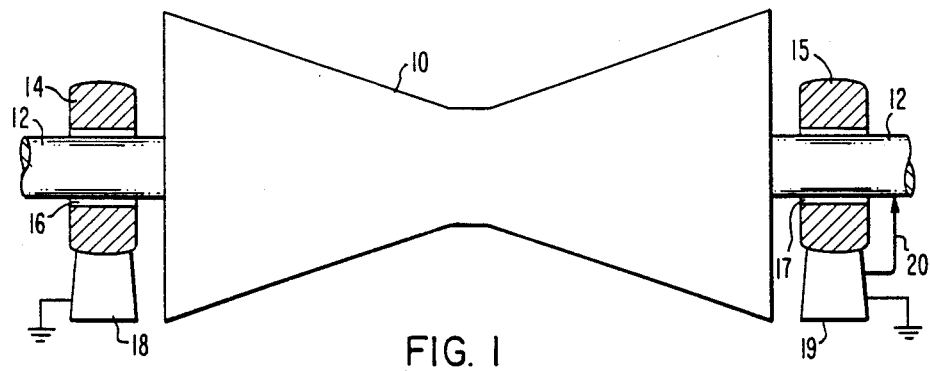
FIG. 1
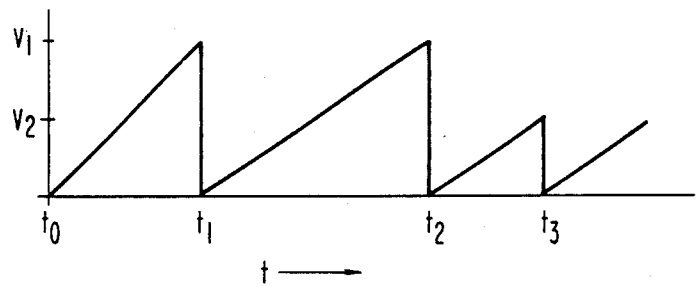
FIG. 2
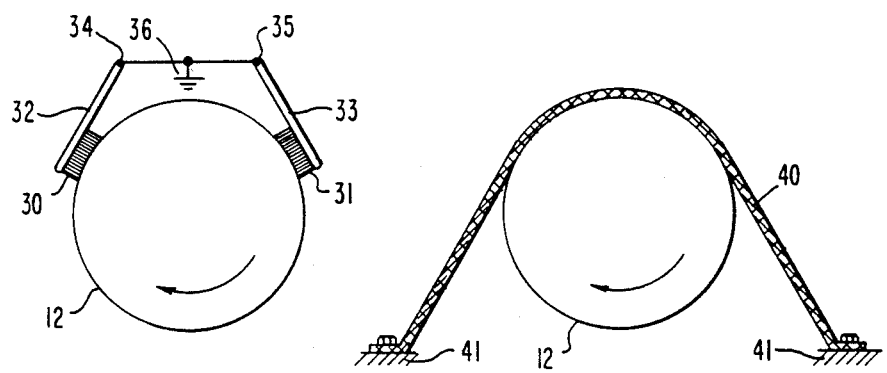
FIG. 3A
PRIOR ART
FIG. 3B
PRIOR ART

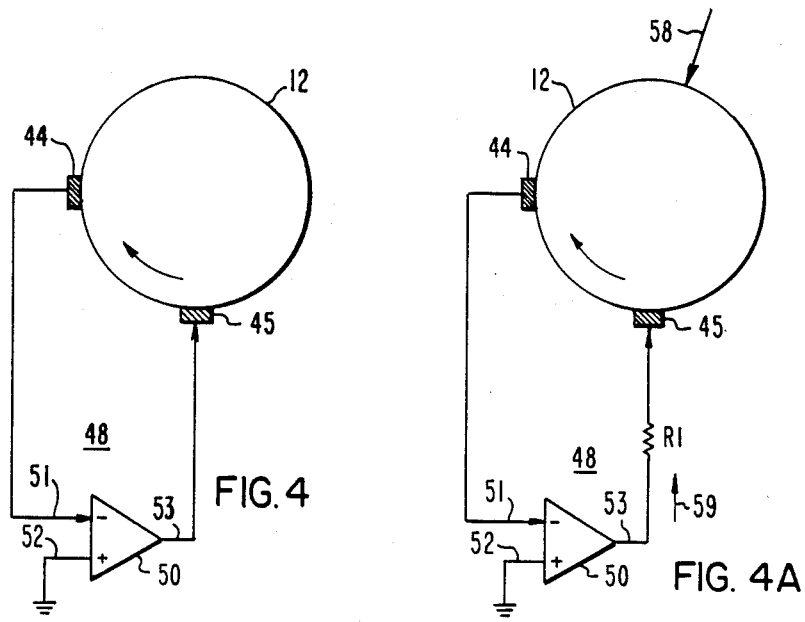
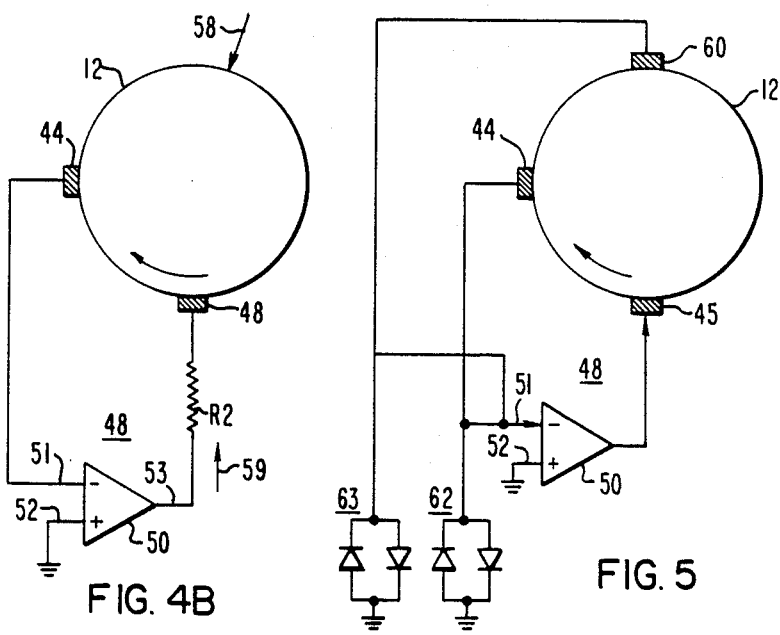
FIG. 4    FIG. 4A    FIG. 4B    FIG. 5

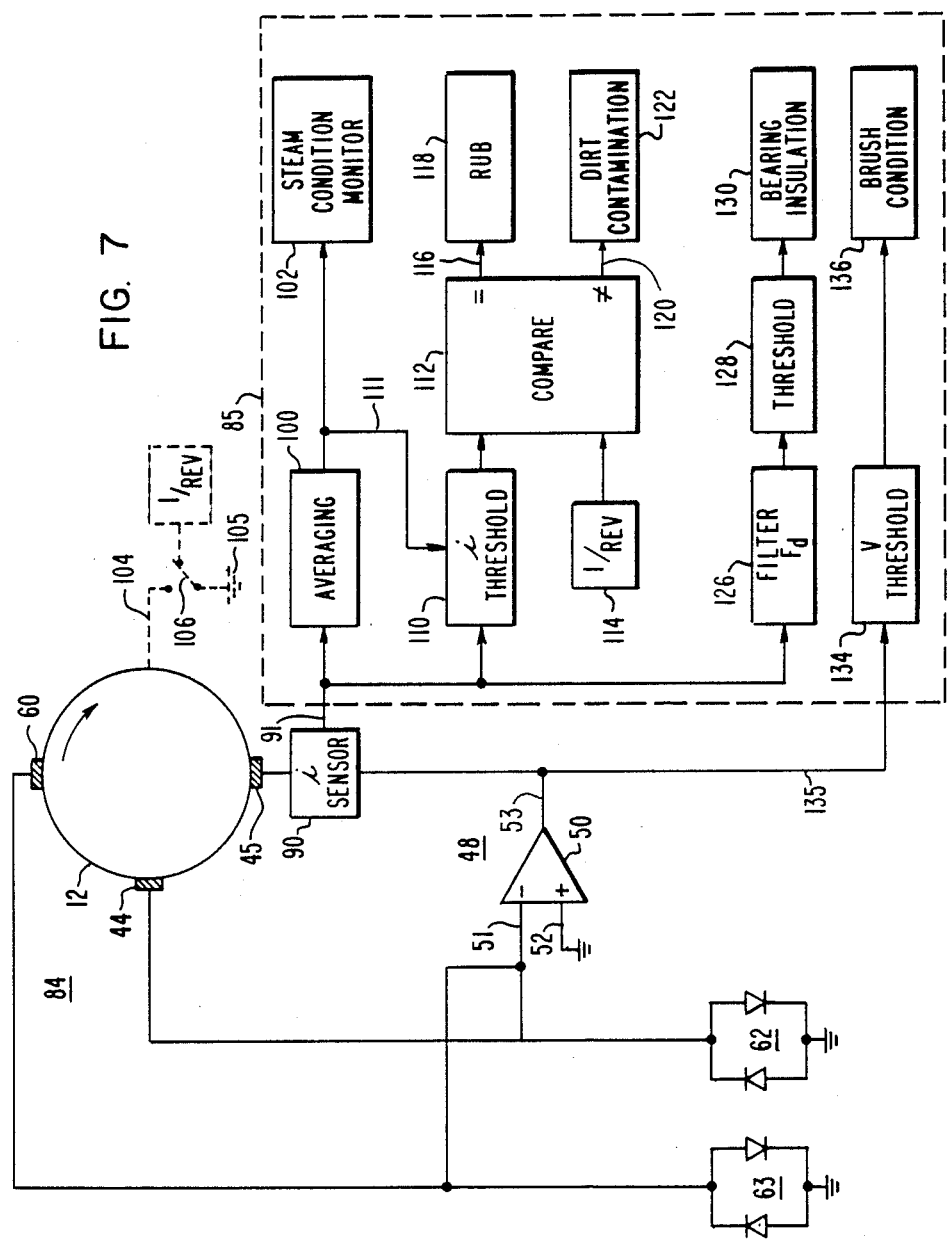

ACTIVE SHAFT GROUNDING AND DIAGNOTIC SYSTEM

BACKGROUND OF THE INVENTION

1. Field of the Invention

The invention in general relates to rotating machinery, and more particularly to apparatus for electrically grounding a portion of the machinery during use and which apparatus will provide information relative to various operating conditions of the machinery.

2. Description of the Prior Art:

Operation of some types of rotating machinery, such as a steam turbine, results in an electrical charge build-up on the rotor, or shaft, which is supported at spaced apart locations by bearings. The shaft actually rides on a thin film of lubricant in the bearing and accordingly is electrically insulated from ground potential. The build-up of an excessive electrical charge on the shaft can cause a discharge through the lubricant film resulting in eventual damage to the bearings.

In order to prevent such discharge, grounding devices are provided for contacting the shaft as it rotates to afford a discharge path to ground for the electrical charge build-up. During the operating life of the grounding device, a film build-up occurs thereby interrupting a continuous path to ground for the electrical charge. A voltage thereby builds up on the shaft to a certain threshold value whereby a discharge through the oil film takes place, leading to bearing damage.

The present invention provides for a system which prevents such bearing damage by preventing or minimizing any charge build-up on the shaft. In addition, the system allows for the diagnosis of different operating conditions of the turbine.

SUMMARY OF THE INVENTION

The grounding arrangement of the present invention is an active shaft grounding system operable with a rotating assembly which has a shaft rotatable relative to a stationary assembly and which is subject to an electrical charge build-up during rotation. The shaft is electrically insulated from, and supported by, spaced apart bearings. First and second electrically conducting contact devices contact the shaft during rotation and a feedback network is connected between the first and second contact devices and is operable to provide a neutralizing current to the shaft, through the second contact device to substantially prevent or minimize the electrical charge build-up, as a function of the voltage at the first contact device.

Means are provided for obtaining an indication of the neutralizing current for diagnostic purposes.

BRIEF DESCRIPTION OF THE DRAWINGS

FIG. 1 is a representation of a rotating machine supported by bearings;

FIG. 2 is a waveform illustrating the voltage on the shaft of the machine of FIG. 1, during rotation;

FIGS. 3A and 3B illustrate typical grounding arrangements for the machine of FIG. 1;

FIG. 4 illustrates one embodiment of the present invention;

FIGS. 4A and 4B illustrate operation of the present invention under various conditions;

FIG. 5. illustrates a modification to the arrangement of FIG. 4;

FIG. 7 illustrates another embodiment of the present invention for providing diagnostic readouts of the machines of FIG. 6.

DESCRIPTION OF THE PREFERRED EMBODIMENT

Figure 6:
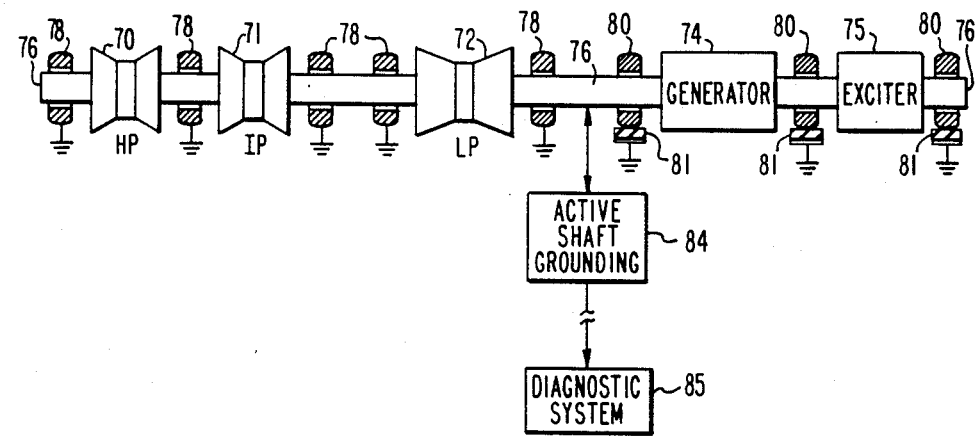
FIG. 6 is a view of a typical steam turbine and generator portion of a power plant.

FIG. 1 illustrates a rotating machine depicted by way of example as a steam turbine 10, the inner structure which is well known. Such structure includes both stationary blades and rotary blades disposed within one or more stationary casings and wherein the rotating blades are connected to a rotor or shaft 12.

Shaft 12 is supported at first and second spaced apart locations by respective bearings 14 and 15 of the type wherein shaft 12 is supported and rotates on a thin film of oil as depicted by numeral 16 in bearing 14 and by numeral 17 in bearing 15, with the oil films providing for electrical isolation between the shaft and bearings. The bearings themselves are supported on respective pedestal structures 18 and 19 which, from an electrical standpoint, are at ground potential.

Due to its operating environment, shaft 12 tends to build up an electrostatic charge which, in the case of a steam turbine, is believed to be due to electron deposition from water droplets impinging on the shaft during operation. Since the rotating shaft 12 is electrically isolated from the stationary portion of the machinery a potentially dangerous voltage differential may build up across oil films 16, 17. If the electrical rating of the thin film of oil is exceeded, an electrical discharge may take place therethrough causing an arcover which if continued, may result in burning of the lubricating oil, pitting, turbulence and eventual bearing failure.

FIG. 2 illustrates the voltage condition as a function of time. Voltage is plotted on the vertical scale, and since the voltage is due to an excess of electrons, the voltage is negative. Subsequent to time $t_0$ the voltage builds up due to the electron deposition to a threshold of value $V_1$ which is of a magnitude to allow a discharge through the oil film, such discharge resulting in an abrupt change of voltage as seen at time $t_1$. Thereafter, the voltage builds up again to value $V_1$ at which time another discharge takes place at time $t_2$. A subsequent build-up is discharged at time $t_3$ at a lower threshold voltage $V_2$ such discharge at the different threshold level being caused, for example, by possible dirt contamination of the lubricating oil.

In order to obviate this potentially dangerous condition, means are generally provided for maintaining shaft 12 at an electrical ground potential. In FIG. 1 this is accomplished with the provision of a grounding device 20 electrically connecting shaft 12 to a pedestal structure 19 (or any other stationary portion of the turbine at ground potential) so as to establish an electric current discharge path between the rotary and stationary portions of the turbine. Typical grounding arrangements are illustrated by way of example in FIGS. 3A and 3B to which reference is now made.

In FIG. 3A, the grounding device is comprised of a pair of electrically conducting brushes 30 and 31, such as carbon-graphite, carried by respective metallic brush holders 32 and 33 pivotable around points 34 and 35. The brushes are spring loaded against the rotating shaft 12 and are electrically connected to ground, indicated by numeral 36, so that any electrostatic charge build-up on the turbine shaft may be carried to ground through the brushes and their respective holders.

Another type of grounding device is illustrated in FIG. 3B and includes a grounding strap 40 of metallic braid which electrically contacts the shaft 12 as well as ground, indicated by numeral 41.

With a grounding arrangement such as illustrated, there is an imperfect electrical contact between the shaft and conducting brushes or strap thus resulting in a threshold voltage which must be exceeded before a static discharge occurs. This threshold voltage may vary, it is believed, as a result of a glaze build-up on the brushes or strap with continued use, due to operating and environmental conditions. Thus, even with the provision of a grounding device, periodic electrical discharge and arcing through the bearing oil film may occur resulting in problems as previously noted.

FIG. 4 illustrates an embodiment of the present invention in its simplest form for actively maintaining the shaft at ground, or substantially ground, potential to prevent arc discharges from the shaft to a stationary portion of the machine. The arrangement of FIG. 4 includes a first electrical contact device in the form of brush 44 as well as a second electrical contact device in the form of brush 45, both making contact with shaft 12 as it rotates. Connected between the first and second brushes is a feedback circuit 48 which provides a neutralizing current at brush 45 to prevent or minimize any electrical charge build-up on the shaft 12, as a function of the voltage appearing at brush 44.

More particularly, the feedback circuit includes an operational amplifier (op amp) 50 having a first or inverting input 51 connected to receive the voltage at brush 44, and a second or non-inverting input 52 connected to a reference potential illustrated as ground. The output 53 of op amp 50 is connected to brush 45 for delivery of the neutralizing current. With a high open loop gain of op amp 50, shaft 12 will be maintained at near ground potential. A simplified operation of the arrangement will be described with further reference to FIGS. 4A and 4B.

In FIG. 4A, arrow 58 contacting shaft 12 represents a shaft current caused by electron deposition at a certain rate from water droplet impingement upon the shaft. Arrow 59 represents a neutralizing current provided by op amp 50 to counteract, or inhibit, the electrical charge build-up on the shaft. Resistance R1 is a lumped resistance representing the resistance of brush 45, the resistance of any glaze that has built up on the brush, and any wire resistance. Utilizing the convention whereby current flows from positive to negative, and electron flow is the reverse of current flow, op amp 50 provides a current 59 which is equal and opposite to current 58. More particularly, with a certain resistance R1, the voltage at output 53 is of a magnitude whereby deposited electrons on shaft 12 are removed at a rate commensurate with their deposition. If current 58 should increase, an electrostatic charge will build up tending to increase the potential (in a negative sense) of the shaft 12. The negative voltage increase as sensed by brush 44 and applied to input 51 causes a corresponding positive increase in the output 53 of a magnitude to increase current 59 to accommodate the increased current 58 so as to prevent further net electrostatic charge build-up.

By way of example, let it be assumed that the shaft current 58 is 10 milliamps (ma), resistance R1 is 10 ohms and the gain of op amp 50 is 10,000. The voltage at output 53 is 100 millivolts (mv) to provide, in conjunction with resistance R1, a current 59 of 10 ma equal to the shaft current 58. With a gain of 10,000, the voltage at input 51 is 0.01 mv.

If the current 58 should tend to rise to 20 ma, the voltage build-up at brush 44 provided to input 51 will cause a corresponding rise in the output voltage of op amp 50 to a magnitude whereby current 59 will be equivalent to current 58 to accommodate the depletion of the electrons from the shaft at the new rate. Under these conditions, both currents will be 20 ma, the voltage at output 53 will be 200 mv, and the voltage at input 51 will be 0.02 mv.

Suppose over a period of time a glaze builds up on the brushes so as to add to the total resistance between the op amp 50 and shaft 12. This situation is illustrated in FIG. 4B where the new and higher valued combined resistance is designated as R2. Suppose that R2 is 100 ohms, 10 times its previous amount in FIG. 4A. With a current 58 of 10 ma and an equivalent current 59 of 10 ma, the voltage at output 53 will be one volt; the voltage at input 51 will be 0.1 mv. Any change in the rate of charge build-up, or any change in resistance between the op amp and shaft, will reflect itself as a corresponding change in shaft voltage which is sensed and utilized to compensate for the change.

Without the present arrangement arcover can occur when the shaft voltage is built up to a magnitude of around 6 volts by way of one example. With the present arrangement, the shaft voltage is maintained at an extremely low voltage in the order of thousandths or even ten thousandths of a volt. With a theoretical open loop gain of infinity, the two inputs to op amp 50 would be maintained equal to one another, that is, the shaft voltage would be maintained at ground potential. Conversely, if the open loop gain is less than that of the 10,000 example, for example 1,000, the shaft voltage would still be maintained in the mv region and far below that which would cause arcover.

FIG. 5 duplicates the arrangement of FIG. 4 together with added modifications. In the event that brush 44 bounces and momentarily loses contact with the shaft 12, an additional or third brush 60 is provided for redundancy. Thus, brush 44 is electrically connected to input 51 of op amp 50 as is brush 60 thereby one acting as backup for the other. Similarly, a redundant brush could be provided for brush 45.

In addition, in the event of any failure of the feedback circuit 48, the shaft voltage might have a tendency to increase to an arcover threshold value. In order to prevent this, diode pairs 62 and 63 are connected to respective shaft voltage sensing brushes 44 and 60 such that one diode of the pair will conduct when its forward voltage drop is attained, thereby limiting the shaft voltage to this diode drop. Depending upon the diodes utilized, this forward voltage drop typically may range from several tenths of a volt to one volt. The diode pairs will not conduct when feedback circuit 48 is operational since the shaft voltage in that instance is maintained substantially near ground potential and in any event way below the diode forward voltage drop.

FIG. 6 is a simplified representation of the steam turbine-generator portion of a power plant. The steam portion of the system consists of a high pressure turbine 70, an intermediate pressure turbine 71 and a low pressure turbine 72. The electrical portion of the system includes a generator 74 and exciter 75 which supplies DC current to the generator rotor coils.

The components are coupled to a common shaft 76 which, in the steam section, is supported by bearings 78 of the type previously described and which are electrically connected to ground. The rotor in the electrical portion is supported by bearings 80 which are not electrically connected to ground but are insulated therefrom by an electrical insulation 81.

An active shaft grounding system 84 is in electrical contact with shaft 76 and is communicative with a diagnostic system 85 for providing indications of certain operating conditions of the steam turbine generator system. FIG. 7 illustrates further details of the arrangement.

In FIG. 7, the active shaft grounding system 84 is the same as that described in FIG. 5 with the addition of a current sensor 90 which is operable to provide an output signal indicative of the current supplied by op amp 50 during operation.

In the steam turbine field, it is known that the proportion of gaseous steam relative to liquid water exiting the low pressure turbine is an indication of turbine performance, or efficiency. From this information, operation of the turbine system can be varied to maximize the efficiency for economic considerations. Since the electric charge build-up is due to the impingement of water drops on the shaft, the total charge therefore will provide some indication of the water volume, and the neutralizing current therfore will provide an indication of the total amount of water passing into the condenser. Accordingly, the output of current sensor 90 provides, on line 91, a signal indicative of the neutralizing current. Averaging circuit 100 receives the current indicative signal to provide an average thereof, such average being indicative of the water passing into the condenser.

The average reading is provided to a steam condition monitor 102 which is operative to provide a readout corresponding to the water volume. Such readout may be the average current itself or the average current may be translated into a corresponding numerical performance or efficiency value by means of a simple lookup table.

An indication of the neutralizing current may be provided for other diagnostic purposes. For example in the case of a steam turbine, a mechanical or thermal condition may occur whereby distortion or abnormal operation of the turbine parts may cause one or more of the turbine blades or seals connected to the turbine shaft to contact a stationary part of the machine thus creating an unwanted and potentially dangerous condition known as a rub. If there is a rub, the shaft will be periodically contacting ground to establish an auxiliary discharge path for any charge build-up.

With the shaft rotating at a known rated speed, the auxiliary discharge path will be established once every revolution. In FIG. 7, this is depicted by the dotted line arrangement which includes a discharge path 104 connected to ground 105 through a switch 106. Switch 106 in effect periodically closes once per revolution to establish the completed discharge path.

Figure 8:
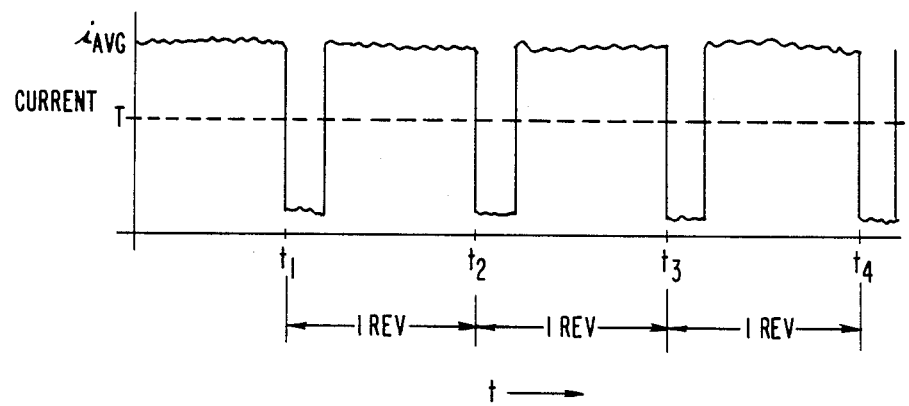
FIG. 8 illustrates a waveform which occurs in the apparatus of FIG. 7 for one operating condition of the machine being diagnosed.

In the absence of a rub, and as previously explained, the active shaft grounding system 84 operates such that the current supplied by op amp 50 will be of a value so as to cancel the effect of any charge build-up. If a rub occurs, the value of neutralizing current will drop abruptly since for an instantaneous period of time, there is no charge build-up by virtue of the alternate path to ground. By way of example, FIG. 8 illustrates a typical current waveform as sensed by sensor 90. During normal operation, the current may vary around some average value $i_{avg}$. At time $t_1$ the current changes abruptly for a moment and then returns to its normal value. One revolution later, at time $t_2$, the current again abruptly changes with such change occurring at each complete revolution at times $t_3$, $t_4$, etc. If the abrupt change crosses some threshold value T and periodically occurs once per revolution, then in all probability a rub condition exists.

Accordingly, diagnostic system 85 of FIG. 7 includes means for analyzing the current signal to determine the presence of a rub condition. To accomplish this, a current threshold circuit 110 is provided and corresponds to the threshold T of FIG. 8. Since this threshold is measured from an average current, averaging circuit 100 is operable to provide its output signal on line 111 to threshold circuit 110 so as to establish an average level. If the abrupt change crosses the threshold level, a series of pulses will be provided to a comparison circuit 112 which also receives a pulse input signal from a once per revolution generator 114 commonly provided in steam turbine control systems. If any pulse signal from threshold circuit 110 and the pulse signal from once per revolution generator 114 are of equal frequency and correlate with one another, then comparison circuit 112 will provide an output on line 116 and which output is an indication of a rub condition. A rub monitor or display 118 is then utilized to inform the operator, such rub monitor in rudimentary form being a light and/or audible alarm.

In addition to a rub situation, an auxiliary discharge path can be caused by dirt contamination in the oil system supplied to the bearings to support the shaft. Such discharges, however, although passing a threshold value will be random. Accordingly, if the pulse frequency provided by threshold circuit 110 is not equal to the pulse frequency provided by the once per revolution generator 114, then comparison circuit will provide an appropriate output signal on line 120 indicating that there is no correlation and which situation is indicative of dirt contamination. An appropriate dirt contamination monitor 122 may be utilized to display such condition, the display being for example a light and/or audible alarm.

In the unlikely event that dirt would cause an auxiliary discharge path at a frequency commensurate with the rotational frequency, comparison circuit 112 may be constructed so as to provide an output rub indicative signal on line 116 only after a predetermined number of revolutions. It is highly unlikely that random dirt contamination would meet these conditions.

In the electrical portion of the power plant of FIG. 6, generator 74 is constructed with a rotor that supplies magnetomotive flux to a surrounding core member. The flux leaves the rotor from a north pole, distributes in opposite directions in the core and returns to a rotor south pole. The core is generally made up in a plurality of sections, with the arrangement giving rise to a slightly different amount of flux in the two flux paths in the core. This flux dissymmetry generates a small dissymmetry voltage at a certain frequency $F_d$ where $F_d$ is a function of the stacking of core sections and rotational speed of the machine.

If the previously insulated bearings 80 should become grounded such as by failure of insulation 81, then the dissymmetry voltage at frequency $F_d$ would manifest itself as a current of frequency $F_d$ superimposed on the previous neutralizing current. Accordingly, the current sensor of FIG. 7 provides its output signal to a filter 126 which is a band pass filter operable to pass a waveform of frequency $F_d$ which if above a certain threshold value as determined by threshold circuit 128 will be indicative of an insulation failure of a bearing associated with the electrical portion of the power plant. This indication may be provided by a bearing insulation monitor 130. An indication of bearing insulation failure will not necessarily mean that the insulation 81 has failed but that the insulation function thereof has failed, such as by a workman's accidental grounding of the bearing.

In FIG. 4A resistance R1 represented the lumped resistance of the wire, brush and glaze. In FIG. 4B resistance R2 represented a much higher value due to the glaze build-up. With a higher value of resistance, the value of the voltage at the output 53 of op amp 50 will necessarily have to be higher in order to maintain the same neutralizing current. Accordingly, the output of op amp 50 is an indication of glaze build-up and means are provided for monitoring this voltage so as to provide an indication of brush (or strap) condition. A voltage threshold circuit 134 is connected, via line 135 to the output of op amp 50 and if a certain threshold voltage is exceeded, brush indication circuit 136 will provide an output signifying that the brushes should be cleaned or replaced.

Accordingly, there has been described a system which automatically maintains the rotating shaft at substantially ground potential so as to prevent any electrostatic charge build-up thereon thereby prolonging the life of certain machinery components. In addition, the grounding arrangement provides the principal signals for diagnosing various operating conditions of the machine thereby leading to substantial economic savings over the life of the machine.

I claim:
1. An active shaft grounding system comprising:
   (A) a rotating assembly having a shaft rotatable relative to a stationary assembly and subject to an electrical charge build-up during rotation;
   (B) said shaft being electrically insulated from, and supported by, spaced-apart bearings;
   (C) a first electrically conducting contact device contacting said shaft;
   (D) a second electrically conducting contact device contacting said shaft;
   (E) feedback circuit means connected between said first and second contact devices and operable to provide a neutralizing current to said shaft, through said second contact device to inhibit said electrical charge build-up, as a function of the voltage at said first contact device; and
   (F) protection means connected between said first contact device and ground potential and operable to limit the voltage of said first contact device to some predetermined maximum value.
2. Apparatus according to claim 1 wherein:
   (A) said protection means includes at least one diode and said maximum value is the voltage drop across said diode when conducting.
3. An active shaft grounding system comprising:
   (A) a rotating assembly having a shaft rotatable relative to a stationary assembly and subject to an electrical charge build-up during rotation;
   (B) said shaft being electrically insulated from, and supported by, spaced-apart bearings;
   (C) a first electrically conducting contact device contacting said shaft;
   (D) a second electrically conducting contact device contacting said shaft;
   (E) feedback circuit means connected between said first and second contact devices and operable to provide a neutralizing current to said shaft, through said second contact device to inhibit said electrical charge build-up, as a function of the voltage at said first contact device; and
   (F) a third electrically conducting device contacting said shaft and connected to said feedback circuit means to form a redundant pair with said first contact device.
4. Apparatus according to claim 3 which includes:
   (A) additional protection means connected between said third contact device and ground potential and operable to limit the voltage at said third contact device to some predetermined maximum value.
5. Apparatus according to claim 4, wherein:
   (A) said protection means includes at least one diode and said maximum value is the voltage drop across said diode when conducting.
6. Apparatus according to claim 3 wherein:
   (A) said first, second, and third contact devices are electrically conducting brushes.
7. An active shaft grounding system comprising:
   (A) a rotating assembly having a shaft rotatable relative to a stationary assembly and subject to an electrical charge build-up during rotation;
   (B) said shaft being electrically insulated from, and supported by, spaced-apart bearings;
   (C) a first electrically conducting contact device contacting said shaft;
   (D) a second electrically conducting contact device contacting said shaft;
   (E) feedback circuit means connected between said first and second contact devices and operable to provide a neutralizing current to said shaft, through said second contact device to inhibit said electrical charge build-up, as a function of the voltage at said first contact device, said feedback circuit means including
       (i) an op amp having a first input, a second input and an output;
       (ii) said first input being connected to said first contact device;
       (iii) said second input being connected to an electrical potential reference; and
       (iv) said output being connected to said second contact device.
8. Apparatus according to claim 7 wherein:
   (A) said electrical reference potential is ground potential.
9. An active shaft grounding system comprising:
   (A) a rotating assembly having a shaft rotatable relative to a stationary assembly and subject to an electrical charge build-up during rotation;
   (B) said shaft being electrically insulated from, and supported by, spaced-apart bearings;
   (C) a first electrically conducting contact device contacting said shaft;
   (D) a second electrically conducting contact device contacting said shaft;
   (E) feedback circuit means connected between said first and second contact devices and operable to provide a neutralizing current to said shaft, through said second contact device to inhibit said electrical charge build-up, as a function of the voltage at said first contact device;

(F) current averaging means for obtaining the average value of said neutralizing current;

(G) means for displaying a representation of said average value;

(H) said shaft being the rotor of a steam turbine.

10. An active shaft grounding system comprising:

(A) a rotating assembly having a shaft rotatable relative to a stationary assembly and subject to an electrical charge build-up during rotation;

(B) said shaft being electrically insulated from, and supported by, spaced-apart bearings;

(C) a first electrically conducting contact device contacting said shaft;

(D) a second electrically conducting contact device contacting said shaft;

(E) feedback circuit means connected between said first and second contact devices and operable to provide a neutralizing current to said shaft, through said second contact device to inhibit said electrical charge build-up, as a function of the voltage at said first contact device;

(F) means for sensing said neutralizing current;

(G) means for providing a pulse signal if said neutralizing current exhibits abrupt changes exceeding a certain threshold value, the frequency of said pulse signal corresponding to the frequency of said abrupt changes;

(H) means for generating a revolution signal for each 360° rotation of said shaft; and (I) means for comparing said pulse signal with said revolution signal.

11. Apparatus according to claim 10 wherein:

(A) said means for comparing provides a first output signal if the frequency of said pulse signal correlates with the frequency of said revolution signal.

12. Apparatus according to claim 11 wherein:

(A) said means for comparing provides a second output signal if the frequency of said pulse signal does not correlate with the frequency of said revolution signal.

13. Apparatus according to claim 12 which includes:

(A) means for displaying said second output signal.

14. Apparatus according to claim 11 which includes:

(A) means for displaying said first output signal.

* * * * *